United States Patent [19]

Sohda et al.

[11] Patent Number: 5,759,423
[45] Date of Patent: Jun. 2, 1998

[54] ELECTRON BEAM WRITING METHOD AND APPARATUS FOR CARRYING OUT THE SAME

[75] Inventors: Yasunari Sohda, Hachioji; Yasuhiro Someda, Kokubunji; Hiroyuki Itoh; Katsuhiro Kawasaki, both of Hitachi-Naka; Norio Saitou, Tokorozawa, all of Japan

[73] Assignee: Hitachi, Ltd., Tokyo, Japan

[21] Appl. No.: 563,329

[22] Filed: Nov. 28, 1995

[30] Foreign Application Priority Data

Nov. 30, 1994 [JP] Japan ..................... 6-296209

[51] Int. Cl.$^6$ .................. B44C 1/22; H01L 21/00
[52] U.S. Cl. ............. 216/45; 156/345; 216/63; 216/66; 219/121.19; 219/121.2; 438/707
[58] Field of Search ............... 156/643.1, 659.11, 156/345; 216/66, 65, 63, 41, 45; 430/5, 296, 311; 219/121.19, 121.2; 438/707, 712, 117, 949

[56] References Cited

U.S. PATENT DOCUMENTS 5,334,282  8/1994  Nakayama et al. ............ 216/41

FOREIGN PATENT DOCUMENTS 3-270215  12/1991  Japan .

OTHER PUBLICATIONS

J. Vac. Sci. Technol., 15(3), May/Jun. 1978, pp. 887–890. (Cited on p. 2, line 14–15 in our specification.)
Proc. of 1989 Intern. Symp. on Micro Process Conference, pp. 59–63. (Cited on p. 3, like 6–7 in our specification.)
Japanese Patent Laid-open No. Hei 3-270215. (Cited on p. 3, line 12 in our specification.)

Pfeiffer, Variable Spot Shaping for Electron–Beam Lithograph, J. Vac. Sci. Technol., 15(3), May/Jun. 1978, pp. 887–890.

Hattori et al., Triangular Shaped Beam Technique in EB Exposure System Ex–7 for ULSI Patten Formation, Proc. of 1989 Intern. Symp. on MicroProcess Conference, pp. 59–63.

Primary Examiner—William Powell
Attorney, Agent, or Firm—Antonelli, Terry, Stout & Kraus, LLP

[57] ABSTRACT

An electron beam writing apparatus comprises: an electron beam source for projecting an electron beam; a first mask provided with a first rectangular aperture for passing the electron beam projected by the electron beam source to shape the electron beam in a primary shaped beam having a rectangular cross section; a second mask provided with a second rectangular aperture for passing the primary shaped beam to shape the primary shaped beam in a secondary shaped beam having a rectangular cross section, and triangular apertures for passing the primary shaped beam to form a secondary shaped beam having a triangular cross section; a first electron beam deflecting system for moving the primary shaped beam on the surface of the second mask; and a second electron beam deflecting system for moving the secondary shaped beam on the surface of a workpiece on which a pattern is to be written. Each of the triangular apertures is formed in a size such that the triangular aperture can be entirely covered with a rectangular image formed by the first shaped beam on the surface of the second mask.

48 Claims, 14 Drawing Sheets

ELECTRON BEAM WRITING METHOD AND APPARATUS FOR CARRYING OUT THE SAME

BACKGROUND OF THE INVENTION

The present invention relates to an electron beam writing method and an apparatus for carrying out the same to be applied to, for example, forming a high-density minute pattern in a process of fabricating a semiconductor integrated circuit and, more particularly, to an electron beam writing method and an apparatus for carrying out the same capable of high-speed, high-accuracy electron beam writing.

Electron beam writing technique is one of lithographic means widely applied to fabricating minute structures, such as semiconductor integrated circuits. The electron beam writing technique in the status quo is low in throughput and is not suitable for application to mass production. A variable-shaped rectangular beam method among currently available methods is the highest in writing speed. The variable-shaped rectangular beam method forms an image of a first mask, i.e., a primary shaped beam, by projecting an electron beam on the first mask having a rectangular aperture, deflects and projects the image of the first mask on a second mask provided with a rectangular aperture so that the image of the first mask overlaps the rectangular aperture of the second mask, deflects and projects an image of the image of the first mask overlapping the rectangular aperture of the second mask, i.e., a secondary shaped beam, deflects and projects the image of the overlapping portion on the surface of a workpiece so that the image of the over lapping portion fall at a desired position on the surface of the workpiece for writing a pattern of a desired shape and a desired size. This method is described in, for example, J. Vac. Sci. Technol., 15(3), pp. 887–890, May/June, 1978.

Although very effective in writing a rectangular pattern, i.e., a pattern having linear outlines parallel to the two adjacent sides of a rectangular image, i.e., parallel to the X-axis and the Y-axis, respectively, this known variable-shaped rectangular beam method is not very effective in writing a pattern having outlines inclined to the X-axis and the Y-axis, i.e., oblique sides, such as a triangular pattern. When writing a pattern having oblique sides by the variable-shaped rectangular beam method, the oblique side is formed by obliquely arranging a plurality of small rectangular elemental images, which requires a large number of elemental images (shots) and is unable to write the oblique line in a satisfactory accuracy.

A method mentioned in Proc. of 1989 Intern. Symp. on Micro Process Conference, pp. 59–63 to solve such a problem forms a triangular secondary shaped beam having a triangular cross section by using a second mask having a keyhole-type aperture, and writes the oblique line with the triangular secondary shaped beam.

A writing method disclosed in JP-A No. 3-270215 forms a triangular secondary shaped beam having a triangular cross section by using a secondary mask provided with triangular apertures in its four corners, and writes the oblique side with the triangular secondary shaped beam.

The former writing method employing the second mask having the keyhole-type aperture, however, needs to use an advanced adjusting method, such as a current function fitting method or a special gold-particle scanning method, for the accurate adjustment of the size and the origin of a triangular pattern to be written, and is unable to form an accurate triangular pattern simply.

The latter writing method employing the second mask provided with the triangular aperture detects a point where transmission current, i.e., beam current transmitted through the triangular aperture, is zero and uses this point as the origin of the triangular pattern. However, the accurate detection of the point where the transmission current is zero is difficult due to noise in the detection system and the like. Since the triangular apertures formed in the four corners of the second mask are remote from the central rectangular aperture, the electron beam needs to be deflected greatly when changing the pattern (a change of a rectangular pattern for a triangular pattern and vice versa). A large deflection of the electron beam causes the electron beam to travel along a path dislocated from the respective axes of the lenses and deflectors, causing an image plane astigmatism in the image of the first mask, which reduces the resolution of the triangular pattern and distorts the image. Particularly, since the two sides of the image of the first mask (rectangular image) is projected on the workpiece (wafer) when forming the triangular beam, the accuracy of the written pattern is affected directly by the astigmatism of the image of the first mask. Accordingly, the deflection of the electron beam must be limited to the least possible extent and hence the triangular apertures must be formed near the optical axis of the electron optical system and as near as possible to the central rectangular aperture.

SUMMARY OF THE INVENTION

Accordingly, it is an object of the present invention to provide an electron beam writing method and an apparatus for carrying the same capable of easily forming and adjusting a triangular pattern and of accurately writing a triangular pattern.

With the foregoing object in view, the present invention provides an electron beam writing apparatus comprising: an electron beam source for projecting an electron beam; a first mask provided with a first rectangular aperture for passing the electron beam projected by the electron beam source to shape the electron beam in a primary shaped beam having a rectangular cross section; a second mask provided with a second rectangular aperture for passing the primary shaped beam to shape the primary shaped beam in a secondary shaped beam having a rectangular cross section, and triangular apertures for passing the primary shaped beam to form a secondary shaped beam having a triangular cross section; a first electron beam deflecting system for moving the primary shaped beam on the surface of the second mask; and a second electron beam deflecting system for moving the secondary shaped beam on the surface of a workpiece on which a pattern is to be written. The triangular apertures are formed in a size such that the triangular apertures can be entirely covered with a rectangular image formed by the first shaped beam formed on the surface of the second mask. In the electron beam writing apparatus in accordance with the present invention, in which a rectangular image of the first mask (first mask image) is made to overlap the triangular aperture of the second mask, and a triangular pattern is written on the surface of the workpiece with the electron beam (secondary shaped beam) passed through a new triangular aperture formed by the overlapping portions of the first mask image and the triangular aperture of the second mask, the size of the triangular apertures of the second mask is smaller than that of the first mask image (rectangular image). Therefore, it is possible to project the first mask image so that only one of the four sides of the first mask image (rectangular image) is projected on the triangular aperture. Consequently, only one of the three sides of the triangular pattern projected on the surface of the workpiece is affected by the astigmatism in the first mask image and hence the triangular pattern can be accurately written.

Desirably, the second rectangular aperture is formed in a size such that the second rectangular aperture can be entirely covered with the first mask image (rectangular image). When the second rectangular aperture is formed in such a size, the triangular apertures arranged adjacent to and around the second rectangular aperture can be disposed nearer to the optical axis of the electron optical system and the deflection of the electron beam necessary for changing a rectangular pattern writing for a triangular pattern writing mode can be reduced, which improves the triangular pattern writing accuracy.

Desirably, the triangular apertures are arranged adjacent to and around the second rectangular aperture so that the respective oblique sides of the triangular apertures extend in different directions, respectively, to enable writing triangular patterns having oblique sides extending in different directions, respectively.

Desirably, the triangular apertures of the second mask have the shapes of right triangles, respectively. Since most patterns to be written on the surface of a workpiece consist of rectangular elemental images, it is desirable that triangular elementary images to be formed by the triangular apertures have the shapes of right triangles. Desirably, the two sides of each right-angled triangular aperture other than the hypotenuse extend in parallel to the two adjacent sides perpendicular to each other of the second rectangular aperture, respectively, to make the respective connecting portions of the rectangular elementary image formed by the second rectangular aperture and the triangular elemental image formed by the triangular aperture having the shape of a right triangle are matched satisfactorily.

Desirably, the second mask has a partial region (vacant region), in which no aperture is formed, of an area which is large enough for entirely covering the first mask image projected, on a prolongation of one of the diagonals of the second rectangular aperture extended on one side of the same diagonal in the region surrounding the second rectangular aperture of the second mask, and vacant regions, in which no aperture is formed, of an area which is large enough for entirely covering the first mask image in two partial regions on the opposite sides of the vacant region on the prolongation of the diagonal of the second rectangular aperture and beside the adjacent two sides of the second rectangular aperture, respectively. These vacant regions enable securing a space in which the first mask image is moved to adjust the overlapping state of the image of the first mask and the second rectangular aperture.

Furthermore, it is desirable that the second mask has a partial region (vacant region), in which no aperture is formed, of an area which is large enough for entirely covering the first mask image in a region surrounding each of the plurality of right-angled triangular apertures on a prolongation of one of the two sides of the right-angled triangular aperture other than the hypotenuse of the same extended from the vertex between the same side and the hypotenuse to secure a space necessary for moving the first mask image when adjusting the overlapping state of the first mask image and the right-angled triangular aperture.

The present invention provides an electron beam writing method comprising steps of: producing an electron beam; projecting the electron beam on a first mask provided with a first rectangular aperture; shaping the electron beam passed through the first rectangular aperture to form a primary shaped beam having a rectangular cross section; projecting the primary shaped beam on a second mask provided with a second rectangular aperture and a plurality of triangular apertures; shaping the primary shaped beam by selectively passing the primary shaped beam through the second rectangular aperture or one of the plurality of triangular apertures to form a secondary shaped beam; and projecting the secondary shaped beam on the surface of a workpiece on which a pattern is to be written. Each of the plurality of triangular apertures of the second mask is formed in a size such that the triangular aperture can be covered entirely with a rectangular image formed by the primary shaped beam (first mask image) on the second mask.

In the electron beam writing method according to the present invention, in which the first mask image (rectangular image) is made to overlap the triangular aperture of the second mask, and a triangular pattern is written on the surface of the workpiece with the electron beam (secondary shaped beam) passed through a new triangular aperture formed by the overlapping portions of the first mask image and the triangular aperture of the second mask, the size of the triangular apertures of the second mask is smaller than that of the first mask image (rectangular image). Therefore, it is possible to project the first mask image so that only one of the four sides of the first mask image (rectangular image) is projected on the triangular aperture. Consequently, only one of the three sides of the triangular pattern projected on the surface of the workpiece is affected by the astigmatism in the first mask image and hence the triangular pattern can be accurately written.

Desirably, the triangular apertures of the second mask are right-angled triangular apertures each having the shape of a right triangle. Desirably, the two sides of each right-angled triangular aperture other than the hypotenuse extend in parallel to the two adjacent sides perpendicular to each other of the second rectangular aperture, respectively, to make the respective connecting portions of the rectangular elemental image formed by the second rectangular aperture and the triangular elemental image formed by the right-triangular aperture are matched satisfactorily.

The electron beam writing method in accordance with the present invention moves the first mask image on the second mask by deflecting the primary shaped beam for the adjustment of the overlapping state of the first mask image and the right-angled triangular aperture to adjust the size of a right-angled triangular pattern formed on the surface of the workpiece. Desirably, the first mask image is moved on the second mask only in one direction parallel to one of the two sides perpendicular to each other of the right-angled triangular aperture to facilitate the adjustment of the size of the right-angled triangular pattern projected on the surface of the workpiece and to improve the accuracy of the adjustment of the size.

When adjusting the overlapping state of the first mask image and the right-angled triangular aperture, the first mask image is moved relative to the right-angled triangular aperture so that only one of the four sides of the first mask image is projected in the right-angled triangular aperture; that is, the two sides among the three sides of a right-angled triangular pattern projected on the surface of the workpiece are the projection of one of the two perpendicular sides of the right-angled triangular aperture, i.e., the side parallel to the direction of movement of the first mask image, and the projection of the hypotenuse of the right-angled triangular aperture, and the intersection point of the two sides of the projected pattern corresponds to an origin for determining the size of the projected pattern, and the position of the origin is determined univocally from the position of the intersection point of the two sides of the right-angled triangular aperture. Since only one of the three sides of the right-angled triangular pattern projected on the surface of the workpiece is affected by astigmatism in the first mask image, an accurate triangular pattern can be written.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

The principle of an electron beam writing apparatus and an electron beam writing method in accordance with the present invention will be described with reference to the accompanying drawings prior to the detailed description of the preferred embodiments of the present invention.

Figure 1:
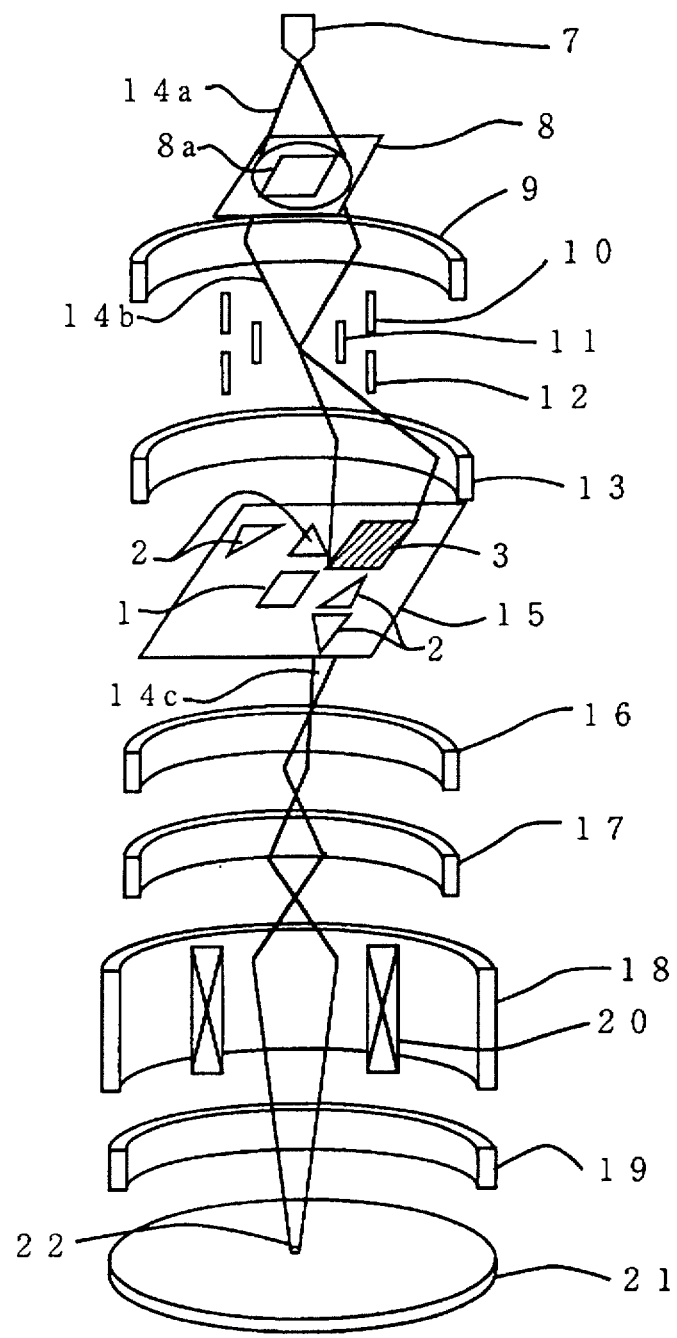
FIG. 1 is a perspective view of an electron optical system included in an electron beam writing apparatus in accordance with the present invention.

Referring to FIG. 1, an electron optical system included in an electron beam writing apparatus in accordance with the present invention comprises an electron beam source 7 for projecting an electron beam 14a; a first mask 8 for shaping an electron beam 14a projected by the electron beam source 7 in a primary shaped beam 14b, a second mask 15 for shaping the primary shaped beam 14b in a secondary shaped beam 14c, projection lenses 9 and 13 for projecting the primary shaped beam 14a shaped by the first mask 8 on the second mask 15, a first electron beam deflector 10 and a second electron beam deflector 12 deflecting the primary shaped beam 14b to select a pattern to be written, an electron beam deflector 11 for adjusting the size of a pattern to be written, reduction lenses 16 and 17 for reducing the section of the secondary shaped beam 14c shaped by the second mask 15, a first objective lens 18 and a second objective lens 19 for projecting the secondary shaped beam 14c having a reduced section on a workpiece (wafer) 21, and an objective deflector 20 for deflecting the secondary shaped beam 14c shaped by the second mask 15 to determine the position of a pattern to be written on the surface of the workpiece 21. Naturally, these components of the electron optical system are contained in a vacuum barrel, not shown.

The first mask 8 is provided with a first rectangular aperture 8a. The electron beam 14a projected by the electron beam source 7 is shaped in the primary shaped beam 14b having a rectangular cross section when the same travels through the first rectangular aperture 8a. The second mask 15 is provided with a second rectangular aperture 1 and a plurality of triangular apertures 2. The primary shaped beam 14b is shaped in the secondary shaped beam 14c having a rectangular or triangular cross section when the same travels through the second rectangular aperture 1 or one of the triangular apertures 2.

The operation of the electron beam writing apparatus will be described hereinafter. The electron beam source 7 projects the electron beam 14a on the first mask 8, and the first mask 8 passes the electron beam 14a through the first rectangular aperture 8a to shape the electron beam 14a in the primary shaped beam 14b. The primary shaped beam 14b travels through the first projection lens 9 and the second projection lens 13 and falls on the second mask 15 to form the rectangular first mask image 3 on the second mask 15. The primary shaped beam 14b is deflected by the first electron beam deflector 10 and the second electron beam deflector 12 to move the first mask image 3 on the second mask 15 so that the first mask image 3 overlap selectively the second rectangular aperture 1 or one of the plurality of triangular apertures 2 of the second mask 15. A portion of the primary shaped beam 14b corresponding to a portion of the first mask image 3 overlapping the selected aperture of the second mask 15 travels through the second mask 15 in the secondary shaped beam 14c having a rectangular or triangular cross section. The secondary shaped beam 14c travels through the reduction lens system including the reduction lenses 16 and 17, and the objective lens system including the objective lenses 18 and 19, and falls on the surface of the workpiece 21 to form a pattern 22, i.e., a rectangular image or a triangular image, to be written on the surface of the workpiece 21. The pattern 22 is moved on the surface of the workpiece 21 to position the same at a writing position by deflecting the secondary shaped beam 14c by the objective deflector 20.

The size of the pattern 22, i.e., a rectangular image or a triangular image, to be written on the surface of the workpiece 21 is adjusted by deflecting the primary shaped beam 14b by the pattern size adjusting electron beam deflector 11 so that the first mask image 3 is moved relative to the selected aperture of the second mask 15 to vary the overlapping state of the first mask image 3 and the selected aperture of the second mask 15, i.e., the size of a portion of the first mask image 3 overlapping the selected aperture.

Figure 2A:
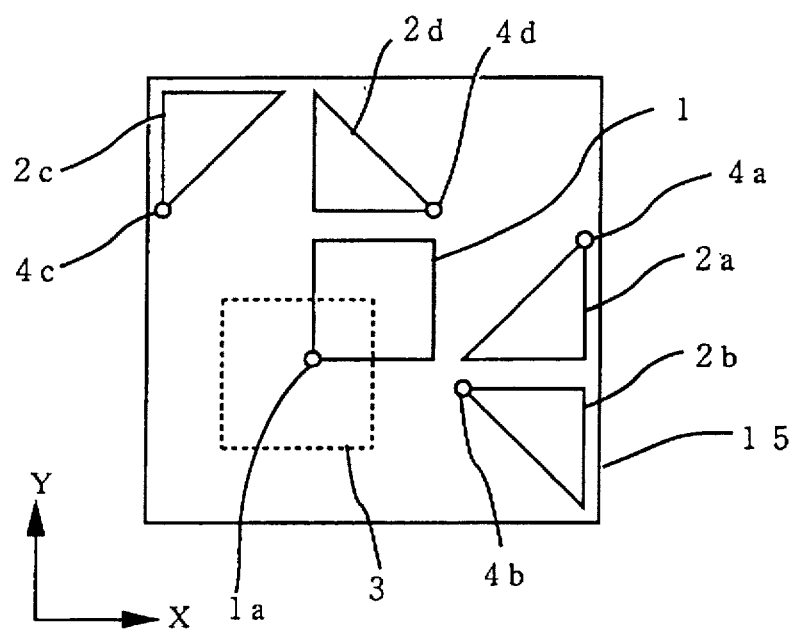
FIG. 2A is a plan view of a second mask in accordance with the present invention.
Figure 2B:
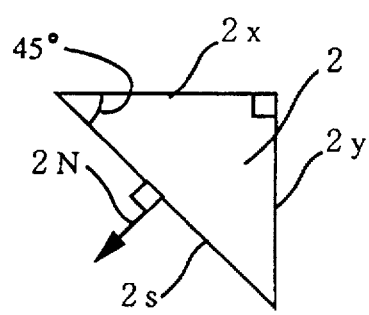
FIG. 2B is a diagrammatic view for assistance in explaining the definition of the direction of the hypotenuse of a triangular aperture formed in the second mask of FIG. 2A.

Referring to FIG. 2A, the second mask 15 is provided with the second rectangular aperture 1 (a square aperture in this embodiment) and the plurality of triangular apertures 2a to 2d (right-angled triangular apertures in this embodiment). The right-angled triangular apertures 2a to 2d are disposed near the second rectangular aperture 1 in a region surrounding the second rectangular aperture 1. The right-angled triangular apertures 2a to 2d are smaller than the first mask image 3, i.e., each of the right-angled triangular apertures 2a to 2d can be entirely covered with the first mask image 3. In this embodiment, the second rectangular aperture 1 is smaller than the first mask image 3. The right-angled triangular apertures 2a to 2d are disposed with the two sides of each of the right-angled triangular apertures perpendicular to each other extended parallel to the two adjacent sides perpendicular to each other of the second rectangular aperture 1, respectively, and with the respective hypotenuses thereof extended in different directions, respectively. In this description, the direction of the hypotenuse of the right-angled triangular aperture 2 corresponds to the direction of the arrow 2N perpendicular to the hypotenuse 2S of the right-angled triangular aperture 2 and outward from the right-angled triangular aperture 2 as shown in FIG. 2. In this embodiment, each of the right-angled triangular apertures 2a to 2d has the shape of an isosceles right triangle having two sides 2X and 2Y perpendicular to each other, and a hypotenuse 2S inclined at 45° to the two sides 2X and 2Y.

When a rectangular pattern is to be written on the surface of the workpiece 21, the first mask image 3 is positioned so as to overlap the second rectangular aperture 1 in an appropriate overlapping state. As shown in FIG. 2A, no aperture is formed in two partial regions having an area greater than at least the first mask image 3, i.e., an area which is large enough to include the first mask image 3, and contiguous with the two sides of the second rectangular aperture 1 meeting at the origin 1a of the second rectangular aperture 1, and in a partial region between those two partial regions, i.e., a partial region on a prolongation of the diagonal passing the origin 1a and extending from the origin 1a, having an area which is large enough to include the first mask image 3. Therefore, a sufficient space is secured for moving the first mask image 3 relative to the second rectangular aperture 1 to adjust the overlapping state of the first mask image 3 and the second rectangular aperture 1. Since the first mask image 3 needs to be moved along the X-axis and the Y-axis relative to the second rectangular aperture 1 when adjusting the shape and size of a rectangular pattern to be written, a space specially for moving the first mask image 3, i.e., a vacant space not provided with any apertures, must be secured. The origin 1a indicates a starting point where the first mask image 3 starts overlapping the second rectangular aperture 1.

When a right-angled triangular pattern is to be written on the surface of the workpiece 21, the first mask image 3 is positioned so as to overlap one of the plurality of right-angled triangular patterns 2a to 2d in a desired overlapping state. As shown in FIG. 2A, partial regions in which no aperture is formed, i.e., vacant regions, having an area which is large enough to include the first mask image 3 are formed on the side of the respective origins 4a, 4b, 4c and 4d of the right-angled triangular apertures 2a, 2b, 2c and 2d, respectively. For example, the vacant region for the right-angled triangular aperture 2a is secured in a region on one side of the origin 4a upward on the Y-axis.

Figure 3:
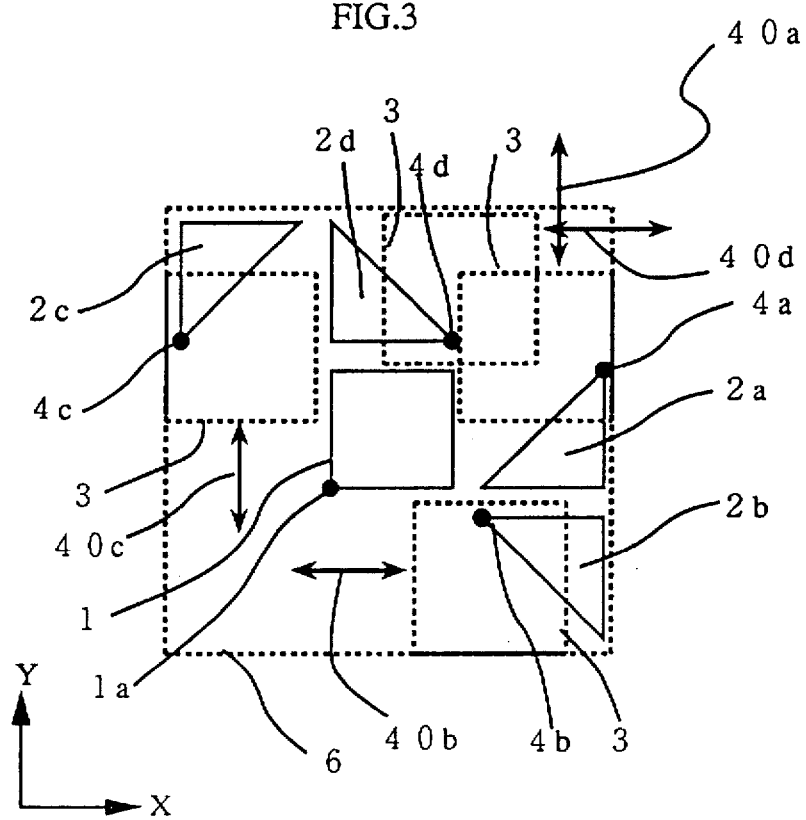
FIG. 3 is a plan view of the second mask of FIG. 2A for assistance in explaining the movement of a first mask image on the second mask.

Referring to FIG. 3, the directions of movement of the first mask image 3 relative to the right-angled triangular apertures 2a, 2b, 2c and 2d when adjusting the overlapping state of the first mask image 3 and the right-angled triangular apertures 2a, 2b, 2c and 2d are indicated by the arrows 40a, 40b, 40c and 40d. For example, when forming a pattern to be written by using the right-angled triangular aperture 2a, the first mask image 3 is positioned in the vacant region above the right-angled triangular aperture 2a, i.e., the vacant region on one side of the right-angled triangular aperture 2a upward on the Y-axis, the first mask image 3 is moved only in the directions indicated by the arrow 40a, i.e., directions along the Y-axis, to adjust the overlapping state of the first mask image 3 and the right-angled triangular aperture 2a. The first mask image 3 and the right-angled triangular aperture 2a is in a nonoverlapping state when the lower side, as viewed in FIG. 3, of the first mask image 3, i.e., the lower one of the two sides parallel to the X-axis of the first mask image 3, coincides with the origin 4a of the right-angled triangular aperture 2a, and are in a maximum overlapping state when the same lower side of the first mask image 3 coincides with the side opposite to the origin 4a, i.e., the side parallel to the X-axis, of the right-angled triangular aperture 2a. In the maximum overlapping state, the first mask image 3 overlaps the right-angled triangular aperture 2a entirely, and a right-angled triangular pattern formed by the secondary shaped beam 14c has an origin corresponding to the origin 4a of the right-angled triangular aperture 2a, and three sides respectively corresponding to the two sides of the right-angled triangular aperture 2a meeting at the origin 4a and the lower side of the first mask image 3. Thus, only one of the four sides of the first mask image 3, i.e., the lower side, is projected in the right-angled triangular aperture 2a. Therefore, only one of the three sides of the triangular pattern projected on the surface of the workpiece 21 is affected by astigmatism in the first mask image 3 and the triangular pattern can be accurately written on the surface of the workpiece 21. Triangular patterns can be formed by using the other right-angled triangular apertures 2b, 2c and 2d by similar processes.

As is obvious from FIG. 3, the regions for the movement of the first mask image 3 can be secured compactly in a region 6 surrounding the central second rectangular aperture 1 by properly arranging the right-angled triangular apertures 2a to 2d and properly selecting the directions of movement of the first mask image 3 relative to the right-angled triangular apertures 2a to 2d. Consequently, the distance, hence the deflection of the first shaped beam 14b, necessary for moving the first mask image 3 to change a pattern to be written, i.e., to change a rectangular pattern for a triangular pattern and vice versa, can be reduced to the least possible extent. Accordingly, the astigmatism in the first mask image 3 can be further reduced and further improve the accuracy of a pattern written on the surface of the workpiece 21.

Preferred embodiments of the present invention will be described in detail with reference to the accompanying drawings.

First Embodiment

Figure 4:
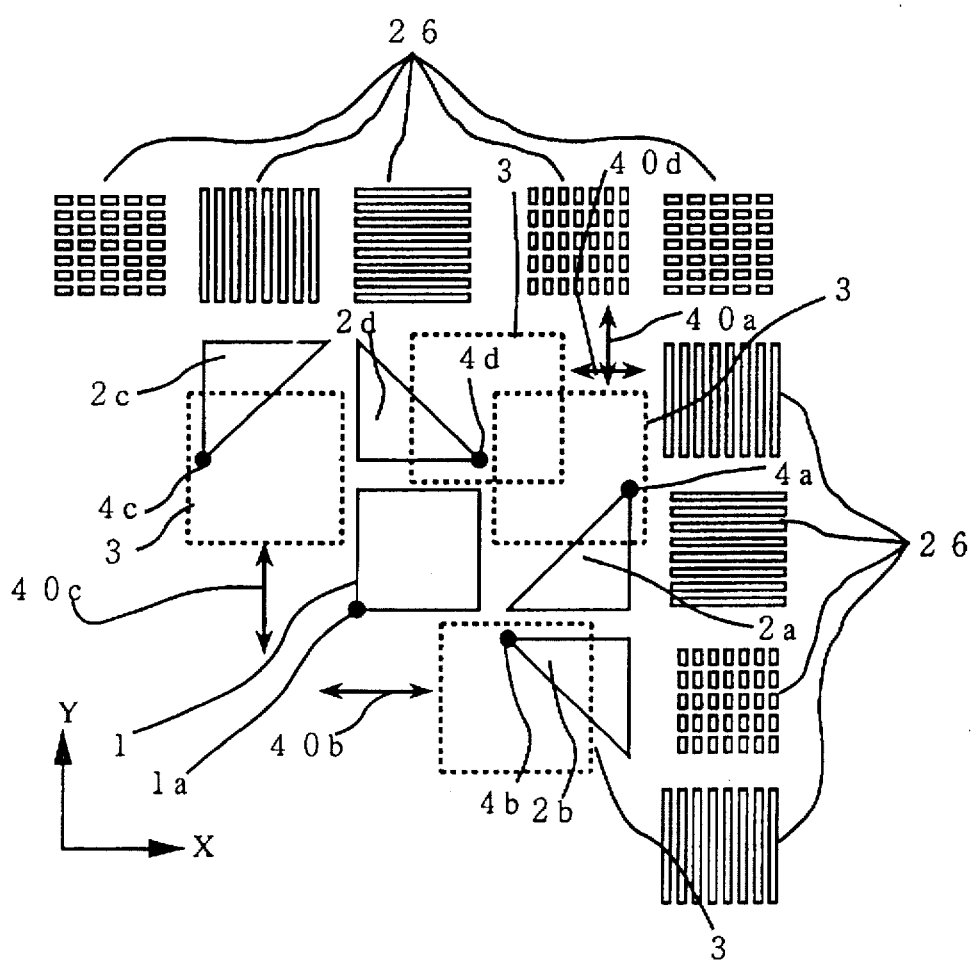
FIG. 4 is a plan view of a second mask employed in a first embodiment of the present invention for assistance in explaining the arrangement of apertures on the second mask.
Figure 5:
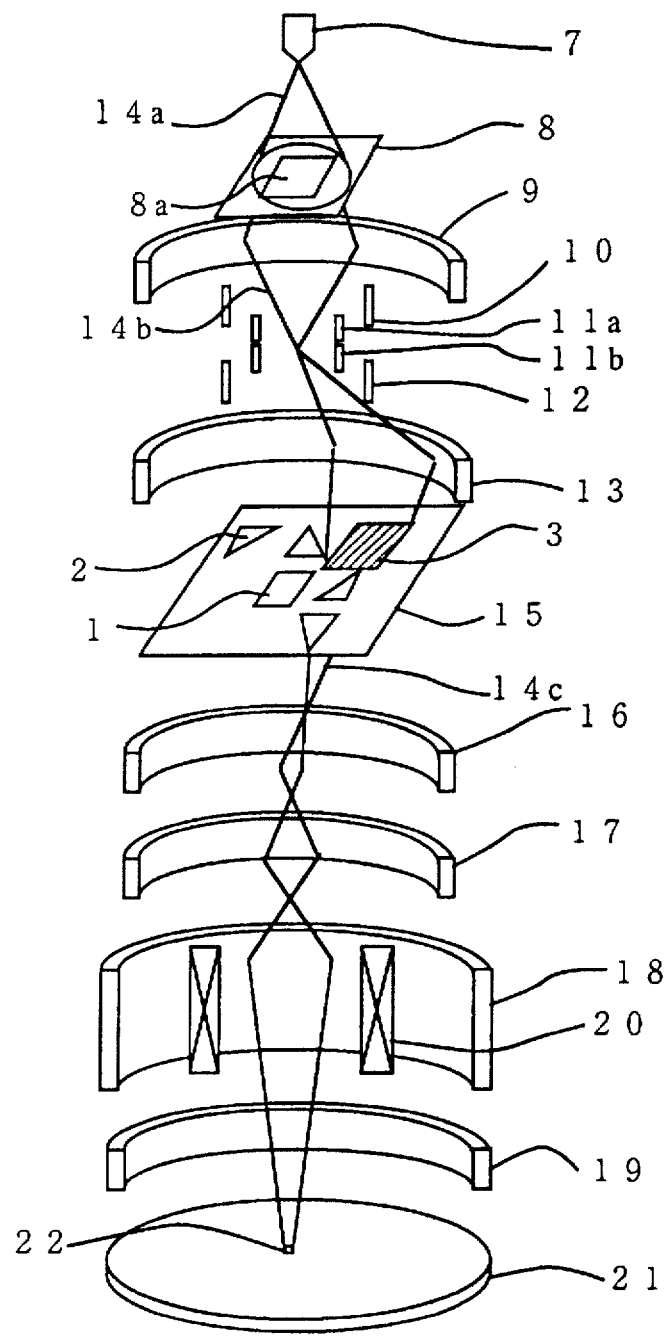
FIG. 5 is a perspective view of an electron optical system included in an electron beam writing apparatus in a first embodiment according to the present invention.

A first embodiment of the present invention will be described with reference to FIG. 4 showing a second mask 15 employed in the first embodiment, and FIG. 5 showing an electron optical system included in an electron beam writing apparatus in the first embodiment.

The second mask 15 is provided with a second rectangular aperture 1 formed in its central region, and four right-angled triangular apertures 2a, 2b, 2c and 2d each having the shape of an isosceles right triangle formed in a region surrounding the second rectangular aperture 1. The respective directions of the hypotenuses of the four right-angled triangular apertures 2a to 2d differ by 90° from each other to enable writing right-angled triangular patterns having hypotenuses directed in different directions, respectively. A plurality of lump pattern apertures 26 for writing memory cells are arranged in a region surrounding the region in which the right-angled triangular apertures 2a to 2d are arranged. The size of each of the apertures 1, 2a–2d and 26 represented by the respective lengths of the sides along the X- and the Y-axis is 125 82 m×125 µm. Since the pattern reduction ratio of the reduction optical system comprising the reduction lenses 16 and 17 is 1/25, the size of the image of each of the apertures 1, 2a–2d and 26 formed on the surface of a workpiece (wafer) 21 represented by the respective lengths of the sides parallel to the X- and the Y-axis is 5 µm×5 µm. The sizes of the right-angled triangular apertures 2a to 2d and the lump pattern apertures 26 are smaller than the first mask image 3 and hence each of the right-angled triangular apertures 2a to 2d and the lump pattern apertures 26 can be entirely covered with the first mask image 3.

Referring to FIG. 5, an electron beam source 7 projects an electron beam 14a on a first mask 8, the first mask 8 passes the electron beam 14a through a rectangular aperture 8a to shape the electron beam 14a in a first shaped beam 14b, the primary shaped beam 14b travels through a first projection lens 9 and a second projection lens 13, falls on the second mask 15 and forms a rectangular first mask image 3 on the surface of the second mask 15. The first mask image 3 is moved on the surface of the second mask 15 by deflecting the first shaped beam 14b by a first electron beam deflector 10 and a second electron beam deflector 12 for pattern selection disposed between the first projection lens 9 and the second projection lens 13 to make the first mask image 3 overlap selectively the rectangular aperture 1, one of the four right-angled triangular apertures 2a to 2d or one of the plurality of lump pattern apertures 26. A portion of the primary shaped beam 14b corresponding to a portion of the first mask image 3 overlapping the selected aperture of the second mask 15 forms a secondary shaped beam 14c. The secondary shaped beam 14c travels through the reduction lens system including the reduction lenses 16 and 17, and the objective lens system including the objective lenses 18 and 19, and falls on the surface of the workpiece 21 to form a pattern 22, i.e., a rectangular pattern, a triangular pattern or a lump pattern, to be written on the surface of the workpiece 21. The pattern 22 is moved on the surface of the workpiece 21 to position the same at a desired writing position by deflecting the secondary shaped beam 14c by the objective deflector 20.

The size of a rectangular or triangular pattern to be written is adjusted by moving the first mask image 3 relative to the selected aperture, i.e., the second rectangular aperture 1 or one of the right-angled triangular apertures 2a to 2d, by deflecting the primary shaped beam 14b by a two-stage deflecting system comprising variable shaping deflectors 11a and 11b disposed in a two-stage arrangement for pattern size adjustment to adjust the overlapping state of the first mask image 3 and the selected aperture, i.e., the size of a portion of the first mask image 3 overlapping the selected aperture. When one of the lump pattern apertures 26 is selected for writing, the first mask image 3 is projected on the second mask 15 so as to overlap the selected lump pattern aperture 26 entirely and the adjustment of the overlapping state of the first mask image 3 and the selected lump pattern aperture 26 is unnecessary.

Since the lump pattern apertures 26 arranged in the periphery of the second mask 15 are spaced far from the central second rectangular aperture 1, the first mask image 3 needs to be moved by a comparatively long distance, i.e., the primary shaped beam 14b needs to be deflected greatly, when changing the pattern to be written. However, since the lump pattern apertures 26 are used when writing in regions where a comparatively large number of repeating patterns are written, the selection of the lump pattern aperture 26 affects the writing time (throughput) scarcely even if the selection of the lump pattern aperture 26 requires much time. On the other hand, the first mask image 3 must be moved quickly for quick selection of the aperture when selecting one of the right-angled triangular apertures because, in many cases, the second rectangular aperture or one of the right-angled triangular apertures is changed for the other right-angled triangular aperture frequently. Therefore, this embodiment employs the two-stage deflecting system comprising the variable shaping deflectors 11a and 11b capable of high-speed deflection instead of the first electron beam deflector 10 and the second electron beam deflector 12. The variable shaping deflectors 11a and 11b has a maximum output of 20 V and a setting time of 100 nsec.

Referring to FIG. 4, the first mask image 3 is moved relative to the right-angled triangular apertures 2a, 2b, 2c or 2d in directions indicated by the arrows 40a, 40b, 40c or 40d when adjusting the size of a triangular patterning; that is, the first mask image 3 is moved relative to the right-angled triangular aperture only in directions along either the X-axis or the Y-axis to project only one of the four sides of the first mask pattern 3 is projected in the right-angled triangular aperture. Accordingly, only one of the four sides of the first mask pattern 3 contributes to the determination of the shape and the size of a pattern to be projected on the surface of the workpiece 21. The first mask image 3 need not necessarily be moved accurately in parallel to the X-axis or the Y-axis; the direction of movement of the first mask image 3 may include an allowable error, provided that only one of the four sides of the first mask image 3 is projected in the right-angled triangular aperture.

As mentioned above, this embodiment changes the size of the triangular pattern by moving the first mask image 3 relative to the right-angled triangular aperture with reference to the origin of the right-angled triangular aperture at one of the opposite ends of the hypotenuse. Therefore, the position of the origin of the triangular pattern on the surface of the workpiece 21 is fixed and the adjustment of the overlapping state of the first mask pattern and the right-angled triangular aperture is facilitated, whereby the size of the triangular pattern projected on the surface of the workpiece 21 can be optionally and accurately changed. The position of the origin of the triangular pattern formed on the surface of the workpiece 21 is univocally dependent on the coordinates of the origin of the right-angled triangular aperture of the second mask 15, and the amount of beam rotation and the reduction ratio of the electron optical system. Therefore, the writing operation does not need any additional work for adjustment, such as origin adjustment. This embodiment uses the two-stage deflecting system comprising the variable shaping deflectors 11a and 11b for moving the first mask image, i.e., deflecting the primary shaped beam, for the adjustment of the size of the triangular pattern.

Generally, a variable shaping deflector is capable of deflecting a beam slightly, but is capable of quick deflection. Therefore, the first mask image 3 can be moved quickly between the second rectangular aperture 1 and the right-angled triangular aperture 2. Accordingly, the method in this embodiment is suitable for writing a pattern having many oblique sections of specific inclinations. The use of the two variable shaping deflectors disposed in a two-stage arrangement and the optimization of the coupling ratio between the two variable shaping deflectors enables the reduction of the off-axis distance of the electron beam when the electron beam is deflected greatly to the least extent. The employment of 8-pole deflectors as the variable shaping deflectors enables further accurate pattern writing operation.

When moving the first mask image 3 by agency of the variable shaping deflectors 11a and 11b disposed in a two-stage arrangement, triangular pattern selecting deflection data for selecting a triangular pattern and pattern size adjusting deflection data for adjusting the size of a selected triangular pattern are given separately to a deflector controller to control the variable shaping deflectors 11a and 11b. The adjustment of the size of the triangular pattern through the adjustment of the deflection sensitivity of the secondary shaped beam 14c having a triangular cross section requires complex processes. Therefore, this embodiment adjusts the deflection sensitivity of the primary shaped beam 14b forming the first mask image 3. The deflection sensitivity of the first mask image 3 (the primary shaped beam) can be known by varying deflecting voltages applied to the variable shaping deflectors 11a and 11b while the first mask image 3 is projected on the second rectangular aperture 1 of the second mask 15, measuring the beam profiles of the secondary shaped beam shaped by the second rectangular aperture 1 for different deflecting voltages, and determining the absolute value of an overlap between the first mask image 3 and the second rectangular aperture 1 on the basis of a value indicating the position of the middle point between the beam profiles. Since the right-angled triangular apertures 2a to 2d are disposed near the second rectangular aperture 1, terms of second degree and above of the distortion of the first mask image 3 due to the deflection of the first shaped beam to move the first mask image 3 can be neglected. Therefore, the method of calibrating the deflection sensitivity of the first mask image 3 using the second rectangular aperture 1 is applicable to the calibration of the second shaped beam having a triangular cross section. Thus, the dependence of the movement of the first mask image 3 on the deflecting voltages applied to the variable shaping deflectors 11a and 11b can be determined.

Figure 6:
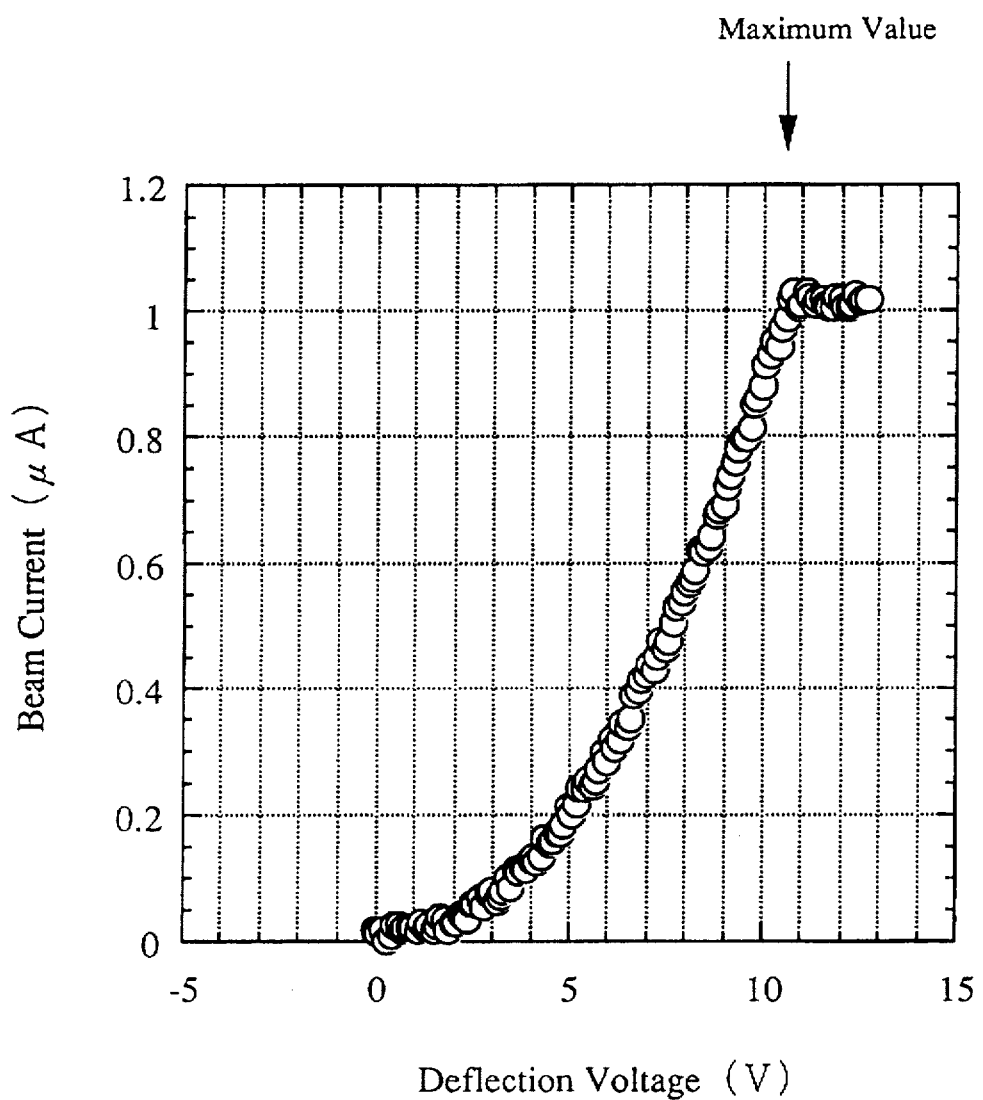
FIG. 6 is a graph showing the dependence of the beam current of an electron beam transmitted through the second mask of FIG. 4 on deflection voltage.
Figure 7:
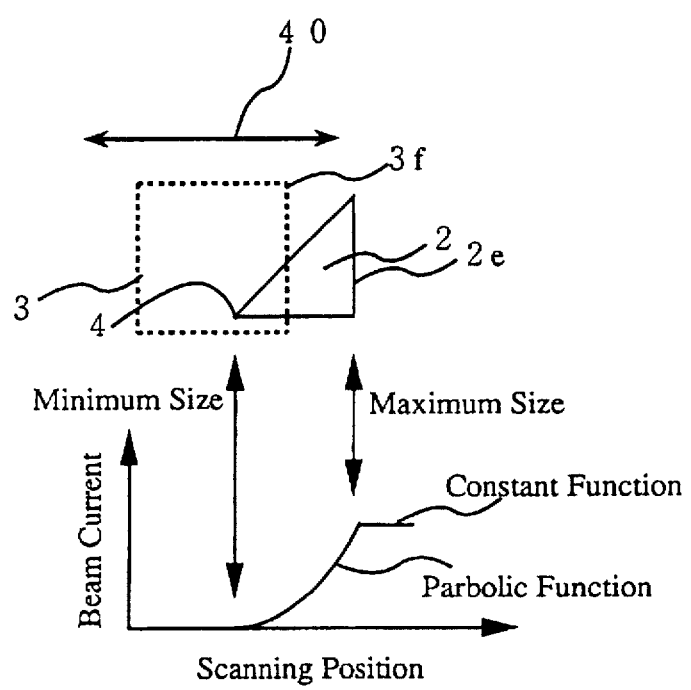
FIG. 7 is a diagrammatic view for assistance in explaining a method of adjusting the maximum size of a triangular pattern by adjusting the beam current.
Figure 8:
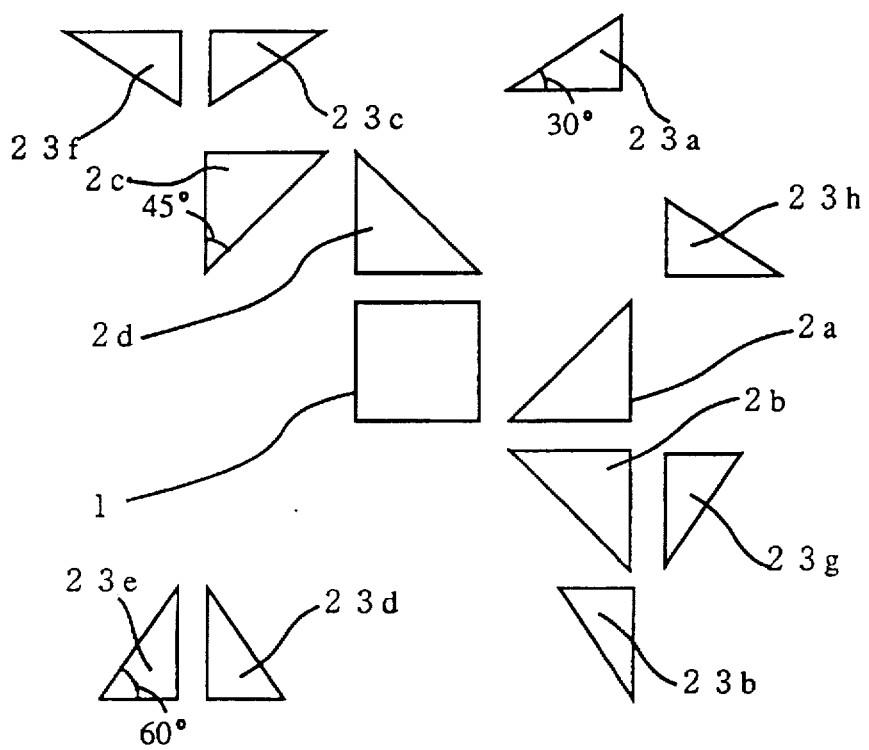
FIG. 8 is a diagrammatic view for assistance in explaining the arrangement of apertures on a second mask employed in an electron beam writing apparatus in a second embodiment according to the present invention.

Then, an origin for overlapping the first mask image 3 and the right-angled triangular aperture 2, i.e., a starting point for determining the deflecting voltage and the size of a triangular pattern, is determined. The origin for overlapping can be determined by an extrapolation method using the aforesaid deflection sensitivity, and the origin for overlapping the first mask image 3 and the second rectangular aperture 1. However, another calibrating method is desirable because the extrapolation method increases errors in deflection sensitivity calibration. An example of a new calibration method will be described with reference to FIGS. 6 and 7. A curve shown in FIG. 6 is obtained by measuring the beam current of the secondary shaped beam passed through the second mask 15 while varying the size of the triangular pattern by the variable shaping deflectors 11a and 11b. In a condition where the first side 3f, i.e., the side overlapping the right-angled triangular aperture 2, of the first mask image 3 is in complete coincidence with the end side 2e, i.e., the side opposite to the origin 4, of the right-angled triangular aperture 2 corresponds to the maximum beam current, i.e., a condition where the beam current curve flattens. The present invention detects a position that makes the beam current reaches a maximum and uses this position as as a base point for the origin. Although a position where the beam current is zero may be used as a base point for the origin, it is very difficult to detect a point where the beam current starts increasing from zero because, as is obvious from FIG. 6, the beam current is very low and the gradient of a section of the beam current near a point where the beam current is zero is very small. A deflection voltage corresponding to the maximum beam current can be accurately detected because the maximum beam current is high and the gradient of the beam current curve changes sharply at a point corresponding to the maximum beam current. Therefore, accurate adjustment can be achieved by using the point corresponding to the maximum beam current as a reference position (position of the origin) for the adjustment of the overlapping state. The point corresponding to the maximum beam current can be determined by fitting a section of the beam current curve in which the beam current increases with the increase of the deflection voltage to a quadratic and fitting a section of the beam current curve in which the beam current remains constant to a function of zero-th degree as shown in FIG. 7. Since the size of the triangular pattern is univocally dependent on the size of the right-angled triangular aperture 2 and the reduction ratio of the electron optical system, the size of the triangular pattern can be adjusted according to the previously determined deflection sensitivity.

The wiring pattern of a 64M DRAM was written on a 6 in. wafer after completing the foregoing adjustment. The number of writing shots necessary for writing the entire pattern was $3 \times 10^8$ when the variable shaped beam method of this embodiment and a lump pattern projection method were used in combination, which was far less than the necessary number of writing shots of $10^{10}$ when only the variable shaped beam method was used, and the necessary number of writing shots of $10^9$ when a conventional variable shaped beam method and a lump pattern projection method were used in combination. The roughness of the oblique lines of the pattern written by this embodiment using the triangular patterns was 0.03 μm, which is about ⅓ the roughness of 0.1 μm of the oblique lines written by the conventional method. Thus, the present invention improves the productivity of semiconductor device producing lines and increases the yield of semiconductor devices.

Second Embodiment

An electron beam writing method in a second embodiment according to the present invention will be described with reference to FIGS. 8 to 11. The second embodiment, similarly to the first embodiment, employs the electron optical system shown in FIG. 5, except that a second mask 15 employed in the second embodiment is different in the shapes and arrangement of triangular apertures from the second embodiment 15 employed in the first embodiment. Referring to FIG. 15 showing a second mask 15 employed in the second embodiment, a plurality of types of triangular apertures respectively having hypotenuses extending in different directions are arranged around a rectangular aperture 1. Isosceles right-angled triangular apertures 2a to 2d are disposed near the rectangular aperture 1, and right-angled triangular apertures 23a to 23d each having a hypotenuse inclined at 30° and right-angled triangular apertures 23e to 23h each having a hypotenuse inclined at 60° are disposed in a region surrounding the isosceles right-angled triangular apertures 2a to 2d. The directions of the hypotenuses of the four triangular apertures of the same type, i.e., the triangular apertures having the hypotenuses inclined at the same angle, are different from each other by 90°. A vacant space, i.e., a space in which no aperture is formed, greater than the first mask image 3 is secured on one side of each of all the right-angled triangular apertures to prevent the leakage of the electron beam when moving the first mask image 3 relative to the right-angled triangular aperture for adjusting the overlapping state of the first mask image 3 and the right-angled triangular aperture to adjust the size of a triangular pattern. The desired right-angled triangular aperture is selected by deflecting the primary shaped beam 14b by the first electron beam deflector 10 and the second electron beam deflector 12, which are able to deflect the primary shaped beam by a large angle of deflection. The electron beam deflectors 10 and 12 have a maximum output of 200 V and a setting time of 10 μsec. The variable shaping deflectors 11a and 11b are used for adjusting the size of the triangular pattern.

Figure 9:
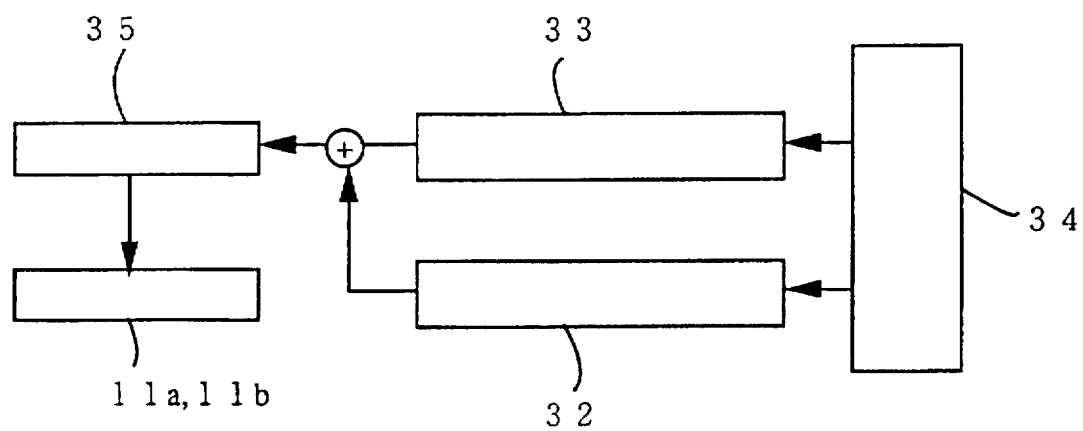
FIG. 9 is a block diagram for assistance in explaining a method of adding deflection signals for deflecting a primary shaped beam (first mask image) by the electron beam writing apparatus in the second embodiment.
Figure 10:
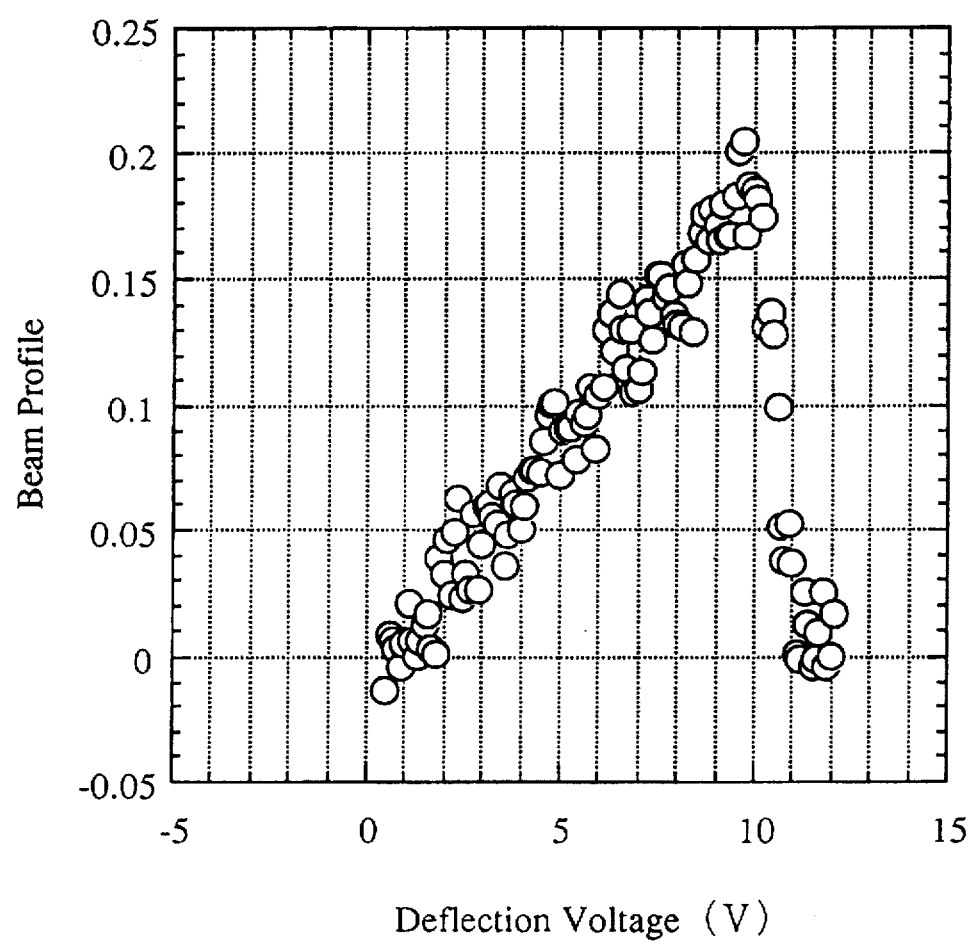
FIG. 10 is a graph showing the dependence of beam profile on deflection voltage in the second embodiment of the present invention.
Figure 11:
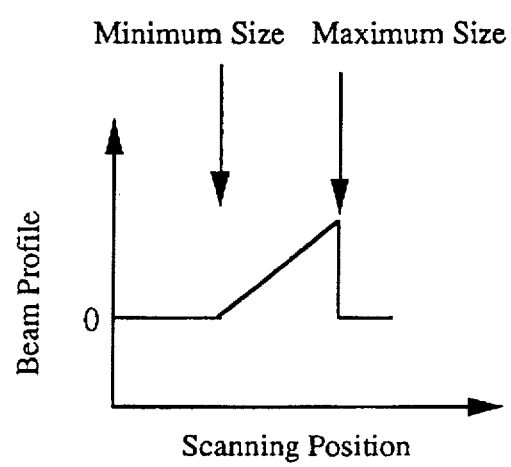
FIG. 11 is a diagrammatic view for assistance in explaining a method of fitting beam profile in the second embodiment of the present invention.

A method of deflecting the primary shaped beam by the variable shaping deflectors 11a, 11b will be described with reference to FIG. 9. A control computer 34 provides pattern size calibrating data 32 and pattern selecting deflection data 33 separately, the pattern size calibrating data 32 and the pattern selecting deflection data 33 are added up to produce a deflection signal, and the deflection signal is given through an analog amplifier 35 to the variable shaping deflectors 11a and 11b to move the first mask image 3 on the second mask 15. The size of the triangular pattern is adjusted on the basis of the relation between the deflection voltage and the beam current. FIG. 10 shows the variation of beam profile with deflection voltage. The curve indicating the variation of beam profile with deflection voltage is fitted to a quadratic function and a linear function as shown in FIG. 11 to determine deflection sensitivity and the origin. Although the sharply varying beam profile curve is suitable for fitting, use of the beam profile curve reduces accuracy when there is large noise. Test writing showed that the accuracy of pattern size adjustment was 0.03 μm when a function of zero-th degree was used and 0.02 μm when a linear function was used.

Although this embodiment employs right-angled triangular apertures having the hypotenuses inclined at 30°, 45° and 60°, respectively, right-angled triangular apertures having the hypotenuses inclined at any optional angles may be used.

Third Embodiment

Figure 12:
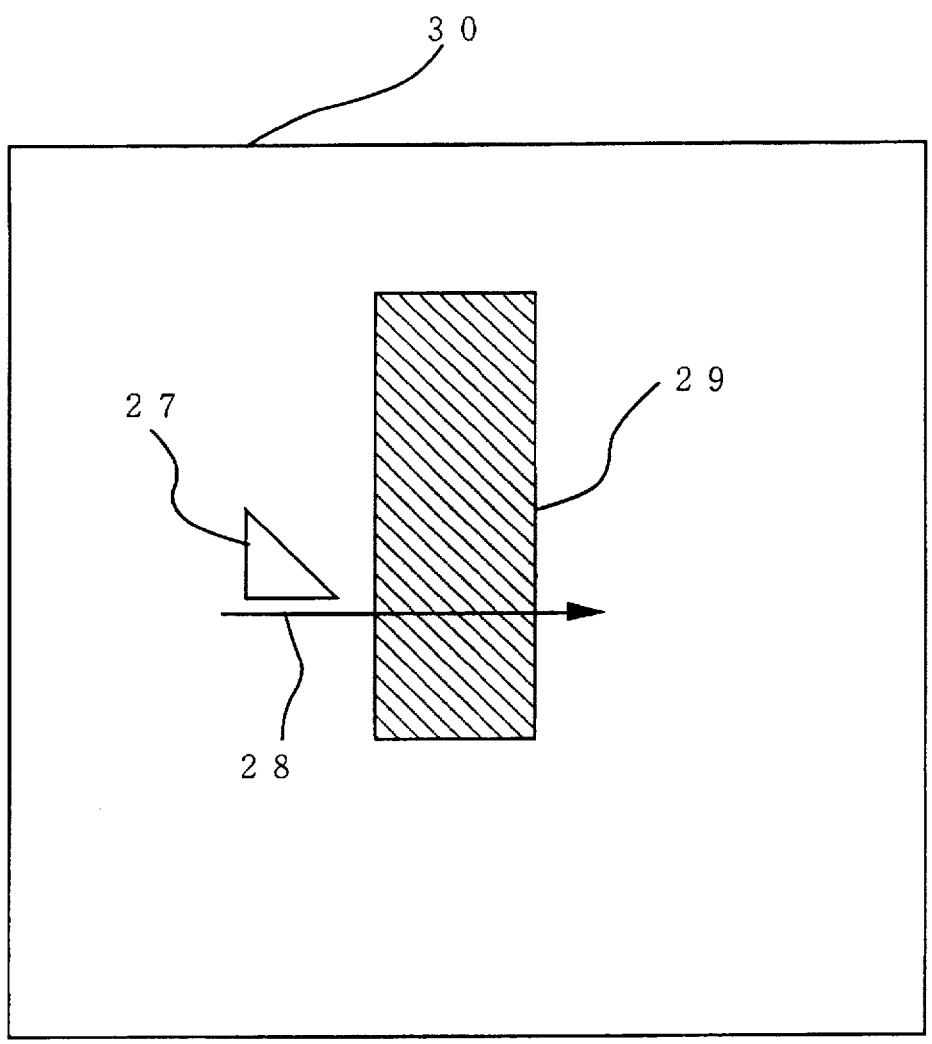
FIG. 12 is diagrammatic view for assistance in explaining a method of measuring the size of a triangular pattern in a third embodiment of the present invention.
Figure 13:
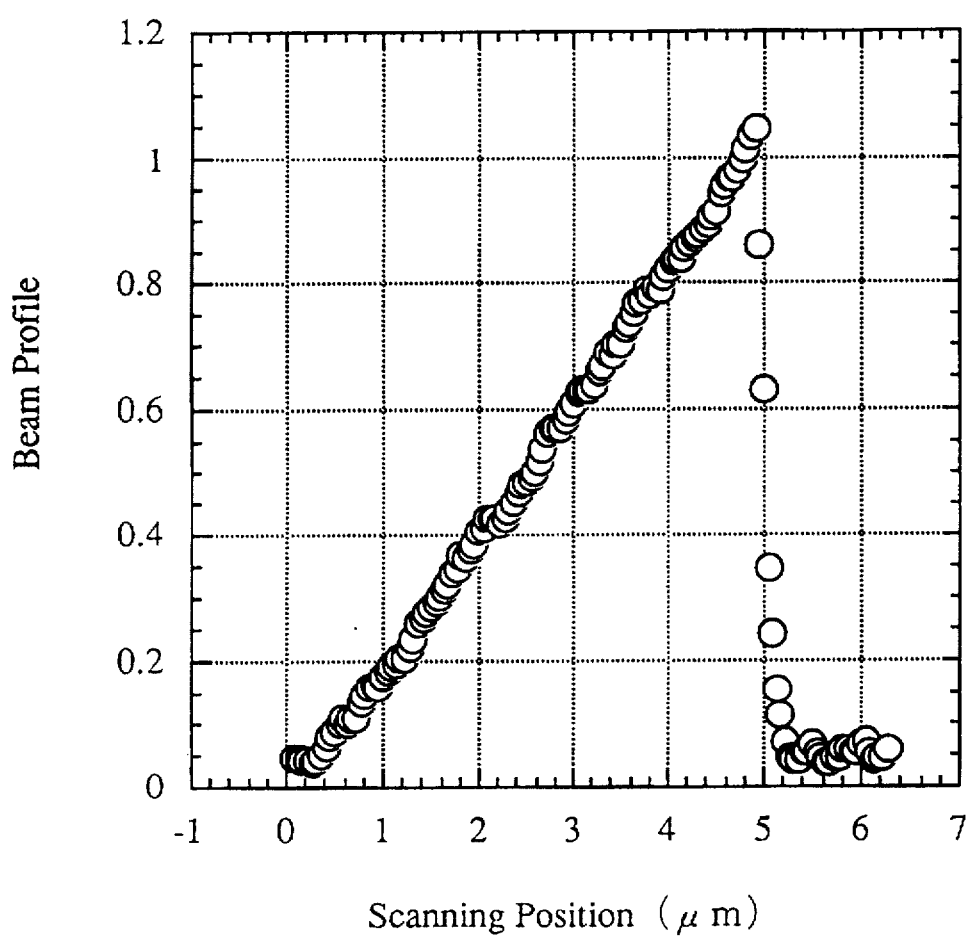
FIG. 13 is a graph for assistance in explaining a method of observing a beam profile of a triangular pattern in the third embodiment of the present invention.
Figure 14:
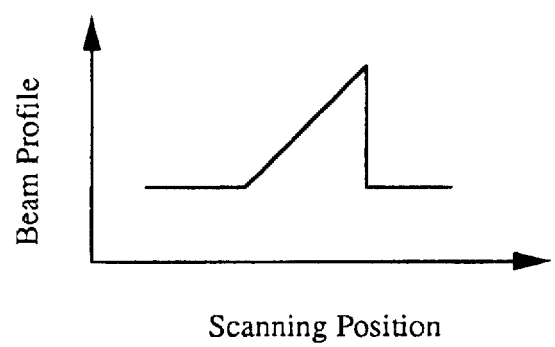
FIG. 14 is a diagrammatic view for assistance in explaining a method of measuring the size of a triangular pattern through the detection of back scattered electrons in the third embodiment of the present invention.

An electron beam writing method in a third embodiment according to the present invention will be described with reference to FIGS. 12 to 14. The third embodiment, similarly to the first embodiment, employs the electron optical system shown in FIG. 5, but a method of adjusting the size of a triangular pattern of the third embodiment is different from that of the first embodiment. The adjustment of the size of a triangular pattern can be easily achieved if the shape of the cross section of a triangular shaped beam, i.e., a shaped beam having a triangular cross section, can be directly measured. Referring to FIG. 12, a straight mark 29 of a tungsten film having a sufficiently large width is formed on the surface of a silicon substrate 30. The mark 29 is scanned with a triangular shaped beam 27 in the direction of the arrow 28 and the intensity of backscattered electrons, i.e., electrons reflected by the mark 29, is measured. A beam profile having a triangular shape as shown in FIG. 13 can be obtained through the first order differentiation of the measured backscatter intensity curve. The beam profile having a triangular shape is subjected to fitting using the length, i.e., the size along the scanning direction, and the height, i.e., the size along a direction perpendicular to the scanning direction, of the triangular pattern to determine the size of the triangular pattern corresponding to the cross section of the triangular shaped beam. A curve obtained by differentiating the beam profile has two sharp peaks at positions corresponding to the front and the back end of the triangular pattern. The size of the triangular pattern can be known from the center positions of the two peaks determined by comparing the two peaks with a predetermined level. Although the latter method and the former method are on the same level in the accuracy of measurement of the size of the triangular pattern, the latter method is able to determine the size of the triangular pattern more quickly than the former method. Both the accuracies of adjustment of the size of the triangular pattern by the former and the latter method were 0.02 μm.

As is apparent from the foregoing description, the present invention facilitates the processes of forming a triangular beam and adjusting the same in an electron beam writing operation, and contributes to the enhancement of electron beam writing speed.

It is further understood by those skilled in the art that the foregoing description is a preferred embodiment of the disclosed device and that various changes and modifications may be made in the invention without departing from the spirit and scope thereof.

What is claimed is:

1. An electron beam writing apparatus comprising: an electron beam source for projecting an electron beam; a first mask provided with a first rectangular aperture for passing the electron beam projected by the electron beam source to shape the electron beam in a primary shaped beam having a rectangular cross section; a second mask provided with a second rectangular aperture for passing the primary shaped beam to shape the primary shaped beam in a secondary shaped beam having a rectangular cross section, and triangular apertures for passing the primary shaped beam to form a secondary shaped beam having a triangular cross section; a first electron beam deflecting system for moving the primary shaped beam on the surface of the second mask; and a second electron beam deflecting system for moving the secondary shaped beam on the surface of a workpiece on which a pattern is to be written; each of said triangular apertures being formed in a size such that the triangular aperture can be entirely covered with a rectangular image formed by the first shaped beam on the surface of the second mask.

2. An electron beam writing apparatus according to claim 1, wherein the second rectangular aperture is formed in a size such that the second rectangular aperture can be entirely covered by the rectangular image formed by the primary shaped beam on the second mask.

3. An electron beam writing apparatus according to claim 1, wherein the triangular apertures are disposed near the second rectangular aperture.

4. An electron beam writing apparatus according to claim 1, wherein the triangular apertures are right-angled triangular apertures.

5. An electron beam writing apparatus according to claim 4, wherein the two sides of each right-angled triangular aperture other than the hypotenuse extend in parallel to the two adjacent sides perpendicular to each other of the second rectangular aperture, respectively.

6. An electron beam writing apparatus according to claim 5, wherein each of the right-angled triangular apertures has the shape of a isosceles right triangle.

7. An electron beam writing apparatus comprising: an electron beam source for projecting an electron beam; a first mask provided with a first rectangular aperture for passing the electron beam projected by the electron beam source to shape the electron beam in a primary shaped beam having a rectangular cross section; a second mask provided with a second rectangular aperture for passing the primary shaped beam to shape the primary shaped beam in a secondary shaped beam having a rectangular cross section, and a plurality of triangular apertures for passing the primary shaped beam to form a secondary shaped beam having a triangular cross section; a first electron beam deflecting means for moving the primary shaped beam on the surface of the second mask; and a second electron beam deflecting means for moving the secondary shaped beam on the surface of a workpiece on which a pattern is to be written; each of said plurality of triangular apertures being formed in a size such that the triangular aperture can be entirely covered with a rectangular image formed by the first shaped beam on the surface of the second mask.

8. An electron beam writing apparatus according to claim 1, wherein the second rectangular aperture is formed in a size such that the second rectangular aperture can be entirely covered by the rectangular image formed by the primary shaped beam on the second mask.

9. An electron beam writing apparatus according to claim 7, wherein the plurality of triangular apertures are formed in a region surrounding the second rectangular aperture.

10. An electron beam writing apparatus according to claim 1, wherein said plurality of triangular apertures are right-angled triangular apertures.

11. An electron beam writing apparatus according to claim 4, wherein the two sides of each right-angled triangular aperture other than the hypotenuse extend in parallel to the two adjacent sides perpendicular to each other of the second rectangular aperture, respectively.

12. An electron beam writing apparatus according to claim 5, wherein each of the right-angled triangular apertures has the shape of a isosceles right triangle.

13. An electron beam writing apparatus according to claim 10, wherein the hypotenuses of the plurality of right-angled triangular apertures extend in different directions, respectively.

14. An electron beam writing apparatus according to claim 13, wherein the number of the plurality of right-angled triangular apertures is four.

15. An electron beam writing apparatus according to claim 9, wherein the second mask has a vacant region, in which no aperture is formed, of an area which is large enough for entirely covering the rectangular image formed by the primary shaped beam on the second mask at least on a prolongation of one of the diagonals of the second rectangular aperture extended on one side of the same diagonal in the region surrounding the second rectangular aperture of the second mask.

16. An electron beam writing apparatus according to claim 11, wherein the second mask has a vacant region, in which no aperture is formed, of an area which is large enough for entirely covering the rectangular image formed by the primary shaped beam on the second mask at least on a prolongation of one of the diagonals of the second rectangular aperture extended on one side of the same diagonal in the region surrounding the second rectangular aperture of the second mask.

17. An electron beam writing apparatus according to claim 10, wherein the second mask has a vacant region, in which no aperture is formed, of an area which is large enough for entirely covering the rectangular image formed by the primary shaped beam on the second mask in a region surrounding each of the plurality of right-angled triangular apertures on a prolongation of one of the two sides of each right-angled triangular aperture other than the hypotenuse of the same extended from the vertex between the same side and the hypotenuse.

18. An electron beam writing apparatus according to claim 11, wherein the second mask has a vacant region, in which no aperture is formed, of an area which is large enough for entirely covering the rectangular image formed by the primary shaped beam on the second mask in a region surrounding each of the plurality of right-angled triangular apertures on a prolongation of one of the two sides of the right-angled triangular aperture other than the hypotenuse of the same extended from the vertex between the same side and the hypotenuse.

19. An electron beam writing apparatus according to claim 16, wherein the second mask has a vacant region, in which no aperture is formed, of an area which is large enough for entirely covering the rectangular image formed by the primary shaped beam on the second mask in a region surrounding each of the plurality of right-angled triangular apertures on a prolongation of one of the two sides of the right-angled triangular aperture other than the hypotenuse of the same extended from the vertex between the same side and the hypotenuse.

20. An electron beam-writing apparatus according to claim 9, wherein the second mask is not provided with any aperture in two partial regions of an area which is large enough for entirely covering the rectangular image formed by the primary shaped beam on the second mask beside the two adjacent sides of the second rectangular aperture and in a partial region of an area which is large enough for entirely covering the rectangular image formed by the primary shaped beam on the second mask between the two partial regions.

21. An electron beam writing apparatus according to claim 11, wherein the second mask is not provided with any aperture in two partial regions of an area which is large enough for entirely covering the rectangular image formed by the primary shaped beam on the second mask beside the two adjacent sides of the second rectangular aperture and in a partial region of an area which is large enough for entirely covering the rectangular image formed by the primary shaped beam on the second mask between the two partial regions.

22. An electron beam writing apparatus according to claim 21, wherein the second mask has a partial region, in which no aperture is formed, of an area which is large enough for entirely covering the rectangular image formed by the primary shaped beam on the second mask in a region surrounding each of the plurality of right-angled triangular apertures on a prolongation of one of the two sides of each right-angled triangular aperture other than the hypotenuse of the same extended from the vertex between the same side and the hypotenuse.

23. An electron beam writing apparatus according to claim 9, wherein the second mask is further provided with lump pattern apertures of optional shapes in a region surrounding the region in which the plurality of triangular apertures are formed.

24. An electron beam writing apparatus according to claim 7, wherein said first electron beam deflecting means comprises an electron beam deflector for moving the primary shaped beam on the surface of the second mask, a first deflection signal feed means for feeding an aperture selecting deflection signal for aperture selection to the electron beam deflector to make the electron beam deflector move the primary shaped beam so that the primary shaped beam overlaps selectively the second rectangular aperture or one of the plurality of triangular apertures, a second deflection signal feed means for feeding an overlapping state adjusting deflection signal for adjusting the overlapping state of the primary shaped beam and a selected aperture, and a signal adding means for adding the aperture selecting deflection signal provided by the first deflection signal feed means and the overlapping state adjusting deflection signal provided by the second deflection feed means to obtain a deflection signal and for giving the deflection signal to the electron beam deflector.

25. An electron beam writing apparatus according to claim 7, wherein the first electron beam deflecting means comprises a plurality of electron beam deflectors.

26. An electron beam writing apparatus according to claim 7, wherein the first electron beam deflecting means comprises a first electron beam deflector for moving the primary shaped beam on the surface of the second mask to make the primary shaped beam overlap selectively the second rectangular aperture or one of the plurality of triangular apertures for aperture selection, and a second electron beam deflector for adjusting the overlapping state of the primary shaped beam and a selected aperture selected by moving the primary shaped beam by the first electron beam deflector for overlapping state adjustment.

27. An electron beam writing method comprising steps of: producing an electron beam; projecting the electron beam on a first mask provided with a first rectangular aperture; shaping the electron beam passed through the first rectangular aperture to form a primary shaped beam having a rectangular cross section; projecting the primary shaped beam on a second mask provided with a second rectangular aperture and a plurality of triangular apertures; shaping the primary shaped beam by selectively passing the primary shaped beam through the second rectangular aperture or one of the plurality of triangular apertures to form a secondary shaped beam; and projecting the secondary shaped beam on the surface of a workpiece on which a pattern is to be written; Each of the plurality of triangular apertures of the second mask being formed in a size such that the triangular aperture can be covered entirely with a rectangular image formed by the primary shaped beam on the second mask.

28. An electron beam writing method according to claim 27, wherein the second rectangular aperture is formed in a size such that the second rectangular aperture can be entirely covered with the rectangular image formed by the primary shaped beam on the second mask.

29. An electron beam writing method according to claim 27, wherein the step of projecting the primary shaped beam on the second mask includes a secondary step of deflecting the primary shaped beam to move the rectangular image formed by the primary shaped beam on the second mask.

30. An electron beam writing method according to claim 27, wherein the step of projecting the secondary shaped beam includes a secondary step of deflecting the secondary shaped beam to move an image formed by the secondary shaped beam on the workpiece on the surface of the workpiece.

31. An electron beam writing method according to claim 29, wherein the step of projecting the secondary shaped beam on the surface of the workpiece includes a secondary step of deflecting the secondary shaped beam to move an image formed by the secondary shaped image on the surface of the workpiece on the surface of the workpiece.

32. An electron beam writing method according to claim 27, wherein all the plurality of triangular apertures are formed in a region surrounding the second rectangular aperture.

33. An electron beam writing method according to claim 32, wherein all the plurality of triangular apertures are right-angled triangular apertures having the shapes of right triangles, respectively.

34. An electron beam writing method according to claim 33, wherein each of the right-angled triangular aperture is disposed with its two sides perpendicular to each other extending in parallel to the two adjacent sides perpendicular to each other of the second rectangular aperture.

35. An electron beam writing method according to claim 34, wherein the hypotenuses of the plurality of right-angled triangular apertures are extended in different directions, respectively.

36. An electron beam writing method according to claim 35, wherein the second mask has a vacant region, in which no aperture is formed, of an area which is large enough for entirely covering the rectangular image formed by the primary shaped beam on the second mask at least on a prolongation of one of the diagonals of the second rectangular aperture extended on one side of the same diagonal in the region surrounding the second rectangular aperture of the second mask.

37. An electron beam writing method according to claim 35, wherein the second mask has a vacant region, in which no aperture is formed, of an area which is large enough for entirely covering the rectangular image formed by the primary shaped beam on the second mask in a region surrounding each of the plurality of right-angled triangular apertures on a prolongation of one of the two sides of each right-angled triangular aperture other than the hypotenuse of the same extended from the vertex between the same side and the hypotenuse.

38. An electron beam writing method according to claim 36, wherein the second mask has a vacant region, in which no aperture is formed, of an area which is large enough for entirely covering the rectangular image formed by the primary shaped beam on the second mask in a region surrounding each of the plurality of right-angled triangular apertures on a prolongation of one of the two sides of each right-angled triangular aperture other than the hypotenuse of the same extended from the vertex between the same side and the hypotenuse.

39. An electron beam writing method according to claim 35, wherein the second mask is not provided with any aperture in two partial regions of an area which is large enough for entirely covering the rectangular image formed by the primary shaped beam on the second mask beside the two adjacent sides of the second rectangular aperture and in a partial region of an area which is large enough for entirely covering the rectangular image formed by the primary shaped beam on the second mask between the two partial regions.

40. An electron beam writing method according to claim 39, wherein the second mask has a vacant region, in which no aperture is formed, of an area which is large enough for entirely covering the rectangular image formed by the primary shaped beam on the second mask in a region surrounding each of the plurality of right-angled triangular apertures on a prolongation of one of the two sides of each right-angled triangular aperture other than the hypotenuse of the same extended from the vertex between the same side and the hypotenuse.

41. An electron beam writing method according to claim 39, wherein the step of projecting the primary shaped beam on the second mask includes an aperture selecting step in which the primary shaped beam is deflected to make the the rectangular image formed by the primary shaped beam on the second mask overlap the second rectangular aperture or one of the plurality of right-angled triangular apertures, and an overlapping state adjusting step in which the primary shaped beam is deflected to adjust the overlapping state of the rectangular image and the selected aperture selected by the aperture selecting step.

42. An electron beam writing method according to claim 41, wherein the adjustment of the overlapping state of the rectangular image and the right-angled triangular aperture in the overlapping state adjusting step is achieved by deflecting the primary shaped beam so as to move the rectangular image only in a direction parallel to one of the two sides perpendicular to each other of the right-angled triangular aperture.

43. An electron beam writing method according to claim 42, wherein the primary shaped beam is deflected to move the rectangular image relative to the right-angled triangular aperture so that only one of the sides of the rectangular image is projected in the right-angled triangular aperture.

44. An electron beam writing method according to claim 42, wherein the rectangular image is moved in the overlapping state adjusting step in a direction so that the distance between a position reached by the rectangular image moved so as to go away from the right-angled triangular aperture overlapped by the rectangular image where the rectangular image and the right-angled triangular aperture are in a nonoverlapping state, and the position of the second rectangular aperture is the shortest.

45. An electron beam writing method according to claim 41, wherein the overlapping state of the rectangular image formed by the primary shaped beam on the second mask and the right-angled triangular aperture selectively overlapped by the rectangular image is determined by by determining the beam profile of the secondary shaped beam by moving an image formed by the secondary shaped beam relative to a straight mark formed on a plane including the surface of a workpiece on which a pattern is to be written, and having a width greater than the width of the image formed by the secondary shaped beam as measured along the direction of movement of the rectangular image formed by the primary shaped beam on the surface of the second mask relative to the right-angled triangular aperture, and fitting the beam profile to a function.

46. An electron beam writing method according to claim 41, wherein the overlapping state of the rectangular image formed by the primary shaped beam on the second mask and the right-angled triangular aperture selectively overlapped by the rectangular image is determined by by determining the beam profile of the secondary shaped beam by moving an image formed by the secondary shaped beam relative to a straight mark formed on a plane including the surface of a workpiece on which a pattern is to be written, and having a width greater than the width of the image formed by the secondary shaped beam as measured along the direction of movement of the rectangular image formed by the primary shaped beam on the surface of the second mask relative to the right-angled triangular aperture, and fitting the beam profile to a function for determining the intersection point of a beam profile differential obtained by differentiating the beam profile, and a differential level.

47. An electron beam writing method according to claim 41, wherein the overlapping state of the rectangular image formed by the primary shaped beam on the second mask and the right-angled triangular aperture selectively overlapped by the rectangular image is determined on the basis of the beam current of the secondary shaped beam passed through the right-angled triangular aperture selectively overlapped by the rectangular image.

48. An electron beam writing method according to claim 41, wherein the overlapping state of the rectangular image formed by the primary shaped beam on the second mask and the right-angled triangular aperture selectively overlapped by the rectangular image is determined on the basis of the deflection of the secondary shaped beam corresponding to the maximum beam current of the secondary shaped beam passed through the right-angled triangular aperture selectively overlapped by the rectangular image.

* * * * *